US012696621B2

(12) United States Patent
Kim et al.

(10) Patent No.: US 12,696,621 B2
(45) Date of Patent: Jul. 28, 2026

(54) ORGANIC LIGHT-EMITTING DISPLAY DEVICE AND THIN-FILM TRANSISTOR ARRAY SUBSTRATE

(71) Applicant: LG Display Co., Ltd., Seoul (KR)

(72) Inventors: Jang Dae Kim, Paju-si (KR); Kyung Su Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 623 days.

(21) Appl. No.: 17/968,272

(22) Filed: Oct. 18, 2022

(65) Prior Publication Data

US 2023/0200133 A1     Jun. 22, 2023

(30) Foreign Application Priority Data

Dec. 16, 2021     (KR) ........................ 10-2021-0180748

(51) Int. Cl.
*H10K 59/121*         (2023.01)
*H10D 86/40*          (2025.01)
        (Continued)

(52) U.S. Cl.
CPC ....... *H10K 59/1213* (2023.02); *H10D 86/441* (2025.01); *H10D 86/60* (2025.01); *H10K 59/126* (2023.02)

(58) Field of Classification Search
CPC .. H10K 59/1213; H10K 59/126; H10K 59/12; H10K 59/121; H10K 59/1216;
        (Continued)

(56) References Cited

U.S. PATENT DOCUMENTS 8,674,359 B2 * 3/2014 Noh ...................... H10D 86/60
                                                    438/798
2013/0075721 A1 * 3/2013 Yamazaki .............. H10D 86/60
                                                    257/43
        (Continued)

FOREIGN PATENT DOCUMENTS

CN        106935628 A     7/2017
CN        112614870 A     4/2021
        (Continued)

OTHER PUBLICATIONS

Korean Intellectual Property Office, Office Action, Korean Patent Application No. 10-2021-0180748, Aug. 13, 2025, 17 pages.
China National Intellectual Property Administration, Office Action, Chinese Patent Application No. 202211167404.0, Nov. 21, 2025, 17 pages.

*Primary Examiner* — Natalia A Gondarenko
(74) *Attorney, Agent, or Firm* — Fenwick & West LLP

(57)     ABSTRACT

An organic light-emitting display device and thin-film transistor array substrate is disclosed. The organic light-emitting display device is capable of reducing the size of a thin-film transistor disposed in a sub-pixel in order to realize a high-definition organic light-emitting display device is disclosed. Conductive regions and non-conductive regions are combined in each of a source region and a drain region, such that the size of a channel is increased, for example, substantially increased. Thus, it is possible to realize a high-definition organic light-emitting display device. Furthermore, s-factor value of a driving thin-film transistor is increased, and the operational speed of a switching thin-film transistor is increased.

19 Claims, 9 Drawing Sheets

(51) Int. Cl.
H10D 86/60 (2025.01)
H10K 59/126 (2023.01)

(58) Field of Classification Search
CPC ............... H10K 59/124; H10K 59/873; H10K
59/8731; H10K 71/30; H10K 71/60;
H10K 71/621; H10D 86/021; H10D
86/0223; H10D 86/0231; H10D 86/411;
H10D 86/423; H10D 86/425; H10D
86/441; H10D 86/481; H10D 86/60;
H10D 30/6713; H10D 30/6723; H10D
30/673; H10D 30/6755; H10D 64/251;
H10D 64/256; H10D 64/258; H10D
64/259; H10D 62/054; H10D 62/056;
H10D 62/10; H10D 62/105; H10D
62/116; H10D 62/149; H10D 62/153;
H10D 62/154; H10D 62/155; H10D
62/60; H10D 62/8271; H10D 62/875
USPC ................................................ 257/40, 43, 72
See application file for complete search history.

(56) References Cited

U.S. PATENT DOCUMENTS

| | | | | |
|---|---|---|---|---|
| 2013/0328053 | A1* | 12/2013 | Roudbari | ............... H10D 86/60 257/E29.292 |
| 2017/0110528 | A1* | 4/2017 | Kim | ................... H10D 30/6757 |
| 2017/0194404 | A1 | 7/2017 | Park et al. | |
| 2018/0012946 | A1* | 1/2018 | Bang | ................. H10D 30/6713 |
| 2020/0111433 | A1 | 4/2020 | Kikuchi et al. | |
| 2021/0104558 | A1* | 4/2021 | Kim | .................... H10D 86/481 |
| 2021/0359065 | A1* | 11/2021 | Jeon | .................... H10K 59/126 |
| 2021/0390920 | A1* | 12/2021 | Kikuchi | ............. G09G 3/3648 |
| 2022/0013669 | A1* | 1/2022 | Wang | ................. H10D 86/0221 |

FOREIGN PATENT DOCUMENTS

| | | |
|---|---|---|
| CN | 113658976 A | 11/2021 |
| WO | WO 2018/180617 A1 | 10/2018 |

* cited by examiner

ORGANIC LIGHT-EMITTING DISPLAY DEVICE AND THIN-FILM TRANSISTOR ARRAY SUBSTRATE

CROSS-REFERENCE TO RELATED APPLICATION

This application claims the benefit of Republic of Korea Patent Application No. 10-2021-0180748, filed on Dec. 16, 2021, which is hereby incorporated by reference in its entirety.

BACKGROUND

Field of Technology

The present disclosure relates to an organic light-emitting display device, and more particularly to an organic light-emitting display device that includes hybrid-type thin-film transistors, in which different types of semiconductor materials are used to form a plurality of thin-film transistors constituting a pixel circuit portion of a sub-pixel and a plurality of thin-film transistors constituting a GIP circuit portion, and that is capable of reducing, for example, minimizing, the size of the thin-film transistors in order to realize a high-definition display device.

Discussion of the Related Art

Unlike a liquid crystal display device using a backlight, an organic light-emitting display device using a self-luminous light-emitting element has a small thickness and exhibits high image quality. Thus, an organic light-emitting display device is the focus of much attention in the display field.

In particular, since it is possible to form a light-emitting element on a flexible substrate, an organic light-emitting display device enables a screen to be created in various forms, such as a bendable screen and a foldable screen. In addition, due to the small thickness thereof, an organic light-emitting display device is suitable for small electronic products, such as smart watches.

Further, in order to be applied to a display device that frequently displays a still image, such as a smart watch, a light-emitting display device including a new type of pixel circuit portion capable of preventing generation of leakage current when displaying a still image is required.

A thin-film transistor that uses an oxide semiconductor as an active layer in order to obtain an improved leakage-current-blocking effect has been proposed.

SUMMARY

However, in a display device that uses hybrid-type thin-film transistors, different types of semiconductor layers, e.g., a polycrystalline semiconductor layer and an oxide semiconductor layer, are used. Thus, a process of forming the polycrystalline semiconductor layer and a process of forming the oxide semiconductor layer are performed separately from each other, thus complicating the manufacturing process. Further, a polycrystalline semiconductor layer and an oxide semiconductor layer have different characteristics with respect to chemical gases, thus complicating the manufacturing process.

In particular, compared to an oxide semiconductor layer, a polycrystalline semiconductor layer is characterized in that carriers, such as electrons or holes, move at a high speed, and is thus suitable for a driving thin-film transistor that is required to be capable of high-speed operation. Accordingly, a polycrystalline semiconductor layer is typically used to form a driving thin-film transistor.

However, a driving thin-film transistor that uses a polycrystalline semiconductor layer operates at a relatively high speed, but is disadvantageous from the aspect of expression of low grayscale values due to a high current fluctuation rate resulting from current stress. Therefore, it is an object of the present disclosure to form a driving thin-film transistor using an oxide semiconductor and to provide a pixel circuit portion in which a current fluctuation rate resulting from current stress is low and an s-factor value is large. In addition, it is another object of the present disclosure to provide a structure capable of reducing (for example, minimizing) the size of a plurality of thin-film transistors disposed in a sub-pixel in accordance with the recent trend toward high-definition display devices.

In order to accomplish the above and other objects, an organic light-emitting display device according to the present disclosure includes a substrate, including a display area and a non-display area, and at least one thin-film transistor, including a semiconductor pattern including a source region and a drain region. Each of the source region and the drain region includes conductive regions and non-conductive regions alternately disposed on the substrate.

The semiconductor pattern may be an oxide semiconductor pattern.

The at least one thin-film transistor may include a gate electrode, overlapping the semiconductor pattern, and a source electrode and a drain electrode, electrically connected to the source region and the drain region, respectively. The conductive regions may include a first conductive region contacting the source electrode or the drain electrode, and a second conductive region disposed between the source electrode or the drain electrode and the gate electrode.

The first conductive region may be made to be conductive by being brought into contact with ions, and the second conductive region may be made to be conductive by ions injected thereinto.

The gate electrode may be disposed in a layer located above the source electrode and the drain electrode.

The gate electrode may be disposed on the same layer as the source electrode and the drain electrode.

The at least one thin-film transistor may include a driving thin-film transistor and at least one switching thin-film transistor. The driving thin-film transistor may include a first light-blocking pattern disposed below the semiconductor pattern and connected to the source electrode.

The driving thin-film transistor may include a first semiconductor pattern, a first gate electrode overlapping the first semiconductor pattern, and a first source electrode and a first drain electrode connected to the first semiconductor pattern. The switching thin-film transistor may include a second semiconductor pattern, a second gate electrode overlapping the second semiconductor pattern, and a second source electrode and a second drain electrode connected to the second semiconductor pattern. The first source electrode, the first drain electrode, the second source electrode and the second drain electrode may be disposed on the same layer.

The first gate electrode and the second gate electrode may be disposed on the same layer. The first gate electrode and the second gate electrode may be disposed on a layer located above the first source electrode, the first drain electrode, the second source electrode, and the second drain electrode.

The first gate electrode and the second gate electrode may be disposed on the same layer as the first source electrode, the first drain electrode, the second source electrode, and the second drain electrode.

The first gate electrode and the second gate electrode may be disposed on different layers from each other. A vertical distance between the first gate electrode and the first semiconductor pattern may be longer than a vertical distance between the second gate electrode and the second semiconductor pattern.

The switching thin-film transistor may include a second light-blocking pattern. A vertical distance between the second semiconductor pattern and the second light-blocking pattern may be longer than a vertical distance between the first semiconductor pattern and the first light-blocking pattern.

The driving thin-film transistor may be disposed in the display area, and the switching thin-film transistor may be disposed in at least one of the display area and the non-display area.

A thin-film transistor array substrate according to the present disclosure includes at least one thin-film transistor including a semiconductor pattern, which includes a source region, a drain region, and a channel region disposed between the source region and the drain region. Each of the source region and the drain region includes at least two conductive regions and a non-conductive region disposed between the at least two conductive regions.

The conductive regions and the non-conductive region may be alternately disposed in each of the source region and the drain region.

The conductive regions may include a first conductive region spaced apart from the channel region, and a second conductive region disposed adjacent to the channel region.

The first conductive region may be made to be conductive by being brought into contact with ions, and the second conductive region may be made to be conductive by ions injected thereinto.

The thin-film transistor array substrate according to the present disclosure may further include a source electrode and a drain electrode, respectively connected to the source region and the drain region, and a light-blocking pattern, disposed below the semiconductor pattern and connected to the source electrode.

The semiconductor pattern may be an oxide semiconductor pattern.

The at least one thin-film transistor may be at least one of a driving thin-film transistor and a switching thin-film transistor.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3 is a cross-sectional view of a thin-film transistor disposed in a non-display area, and a pixel circuit portion and a light-emitting element portion disposed in a pixel area along a line I-I' in FIG. 1, according to the embodiment of the present disclosure;

FIG. 4 is a cross-sectional view showing a driving thin-film transistor and a switching thin-film transistor in the pixel area of FIG. 3, in detail, according to the embodiment of the present disclosure;

FIG. 6 is a cross-sectional view of a driving thin-film transistor and a switching thin-film transistor in a pixel area according to another embodiment of the present disclosure;

DETAILED DESCRIPTION

Figure 1:
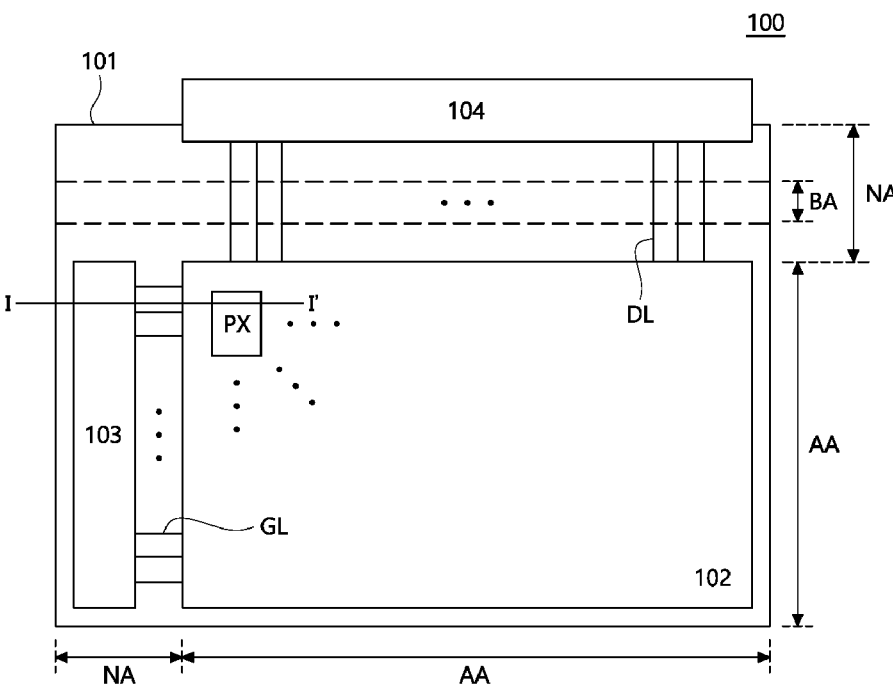
FIG. 1 is a schematic view of a display device according to an embodiment of the present disclosure.

Advantages and features of the present disclosure and methods for achieving them will be made clear from embodiments described below in detail with reference to the accompanying drawings. The present disclosure may, however, be embodied in many different forms, and should not be construed as being limited to the embodiments set forth herein. Rather, these embodiments are provided so that this disclosure will be thorough and complete, and will fully convey the scope of the disclosure to those skilled in the art.

In the drawings for explaining the exemplary embodiments of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear.

The terms "comprises," "includes," and/or "has", used in this specification, do not preclude the presence or addition of other elements unless used along with the term "only". The singular forms are intended to include the plural forms as well, unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on", "above", "below", "next to", or the like, one or more other parts may be located between the two parts unless the term "directly" or "closely" is used.

Spatially relative terms such as "below", "beneath", "lower", "above", and "upper" may be used herein to describe one element's or constituent component's relationship to another element or constituent component as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements would then be oriented "above" the other elements. The exemplary term "below" or "beneath" can, therefore, encompass both an orientation of above and below. Similarly, the exemplary term "above" or "upper" can encompass both an orientation of above and below.

In the description of the various embodiments of the present disclosure, when describing temporal relationships, for example, when the temporal relationship between two actions is described using "after", "subsequently", "next", "before", or the like, the actions may not occur in succession unless the term "directly" or "just" is used therewith.

It may be understood that, although the terms "first", "second", etc. may be used herein to describe various elements, these elements are not to be limited by these terms. These terms are merely used to distinguish one element from another. Therefore, in the present specification, an element indicated by "first" may be the same as an element indicated by "second" without exceeding the technical scope of the present disclosure, unless otherwise mentioned.

The term "at least one" should be understood as including all possible combinations which can be suggested from one or more relevant items. For example, the meaning of "at least one of a first item, a second item, or a third item" may be each one of the first item, the second item, or the third item and also be all possible combinations that can be suggested from two or more of the first item, the second item, and the third item.

The respective features of the various embodiments of the present disclosure may be partially or entirely coupled to and combined with each other, and various technical linkages and modes of operation thereof are possible. These various embodiments may be performed independently of each other, or may be performed in association with each other.

It should be noted that when reference numerals are assigned to the elements of the drawings, the same or similar elements are denoted by the same reference numerals even when they are depicted in different drawings.

In the embodiments of the present disclosure, a source electrode and a drain electrode are distinguished from each other for convenience of explanation. However, the source electrode and the drain electrode may be interchanged. The source electrode may be the drain electrode, and the drain electrode may be the source electrode. Also, the source electrode in any one embodiment may be the drain electrode in another embodiment, and the drain electrode in any one embodiment may be the source electrode in another embodiment.

In one or more embodiments of the present disclosure, for convenience of explanation, a source region is distinguished from a source electrode, and a drain region is distinguished from a drain electrode. However, embodiments of the present disclosure are not limited thereto. For example, a source region may be a source electrode, and a drain region may be a drain electrode. Also, a source region may be a drain electrode, and a drain region may be a source electrode.

The respective features of the various embodiments of the present disclosure may be partially or entirely coupled to and combined with each other, and can be interlocked and operated in various technical ways, as will be fully understood by a person having ordinary skill in the art, and the embodiments can be carried out independently of or in association with each other.

Hereinafter, various embodiments of the present disclosure will be described in detail with reference to the accompanying drawings.

FIG. 1 is a plan view of a display device 100 according to an embodiment of the present disclosure.

A display panel 102 includes a display area AA and a non-display area NA disposed adjacent to the display area AA, which are disposed in a substrate 101. For example, the substrate 101 may be formed of a flexible plastic material so as to be bendable. For example, the substrate 101 is formed of polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC). However, glass is not excluded as the material of the substrate.

A sub-pixel in the display area AA includes a thin-film transistor that uses an oxide semiconductor material as an active layer.

At least one of a data-driving unit 104 and a gate-driving unit 103 may be disposed in the non-display area NA. In addition, the non-display area NA may further include a bending area BA, in which the substrate 101 is capable of being bent.

The gate-driving unit 103 may be directly formed on the substrate 101 using a thin-film transistor that uses a polycrystalline semiconductor material as an active layer. Alternatively, the gate-driving unit 103 may include a thin-film transistor that uses a polycrystalline semiconductor material as an active layer and a thin-film transistor that uses an oxide semiconductor material as an active layer.

The thin-film transistor having an oxide semiconductor layer and the thin-film transistor having a polycrystalline semiconductor layer have high electron mobility in a channel, and are therefore capable of exhibiting high resolution and of being driven with low power.

A plurality of data lines and a plurality of gate lines may be disposed in the display area AA. For example, the plurality of data lines may be disposed in rows or columns, and the plurality of gate lines may be disposed in columns or rows. In addition, sub-pixels PX may be disposed in regions defined by the data lines and the gate lines.

The gate-driving unit 103 including a gate-driving circuit may be disposed in the non-display area NA. The gate-driving circuit of the gate-driving unit 103 sequentially supplies a scan signal to the plurality of gate lines GL, thereby sequentially driving the respective pixel rows in the display area. Here, the gate-driving circuit may also be referred to as a scan-driving circuit. Further, the pixel row refers to a row formed by pixels connected to one gate line.

The gate-driving circuit may be composed of a thin-film transistor having a polycrystalline semiconductor layer, a thin-film transistor having an oxide semiconductor layer, or both a thin-film transistor having a polycrystalline semiconductor layer and a thin-film transistor having an oxide semiconductor layer. In the case in which the same semiconductor material is used in the thin-film transistors disposed in the non-display area NA and the display area AA, the thin-film transistors may be formed simultaneously through the same process.

The gate-driving circuit may include a shift register and a level shifter.

In the display device according to the embodiment of the present disclosure, the gate-driving circuit may be implemented as a gate-in-panel (GIP) type, and may be directly disposed on the substrate 101.

The gate-driving unit 103 including the gate-driving circuit sequentially supplies a scan signal having an on voltage or an off voltage to the plurality of gate lines.

The display device 100 according to the embodiment of the present disclosure may further include a data-driving circuit. When a specific gate line is opened by the gate-driving unit 103 including the gate-driving circuit, the data-driving circuit converts image data into an analog-type data voltage (for example, data voltage Vdata as shown in FIG. 2), and supplies the analog-type data voltage to the plurality of data lines.

The plurality of gate lines GL disposed on the substrate 101 may include a plurality of scan lines and a plurality of emission control lines. The plurality of scan lines and the plurality of emission control lines are wires that transmit different types of gate signals (scan signals and emission control signals) to gate nodes of different types of transistors (scan transistors and emission control transistors).

Figure 2:
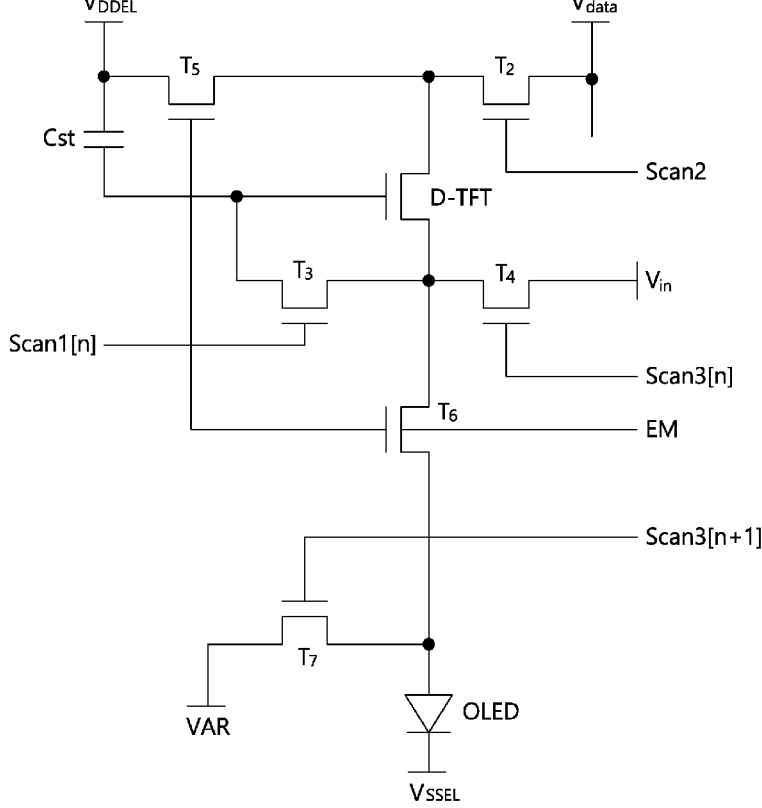
FIG. 2 is a circuit diagram showing a pixel circuit for driving a pixel in the display device according to the embodiment of the present disclosure.

The gate-driving unit 103 including the gate-driving circuit may include a scan-driving circuit, which outputs scan signals (for example, scan signals Scan 1 [n], Scan 2 [n], Scan 3 [n] and Scan 3 [n+1] as shown in FIG. 2) to a plurality of scan lines, which are gate lines GL of one kind, and an emission-driving circuit, which outputs emission control signals (for example, an emission control signal EM as shown in FIG. 2) to a plurality of emission control lines, which are gate lines GL of the other kind.

The data lines DL may be disposed so as to pass through the bending area BA. Various data lines DL may be disposed so as to be connected to a data pad PAD (not shown in FIG. 1).

The bending area BA may be an area in which the substrate 101 is capable of being bent. The substrate 101 may be maintained in a flat state in an area other than the bending area BA.

FIG. 2 is a pixel circuit diagram of a sub-pixel according to an embodiment of the present disclosure. A pixel circuit diagram in which seven thin-film transistors T2, T3, T4, T5, T6, T7 and D-TFT and a single storage capacitor Cst are provided is given by way of example. One of the seven thin-film transistors (for example, D-TFT) may be a driving thin-film transistor, and the remaining ones thereof may be switching thin-film transistors for internal compensation. As shown in FIG. 2, an anode of a light emitting element OLED is electrically connected to the thin-film transistor T6, and a cathode of the light emitting element OLED is electrically connected to a low power supply voltage VSSEL. One electrode of the storage capacitor Cst is electrically connected to a gate electrode of the thin-film transistor D-TFT, and the other electrode of the storage capacitor Cst is electrically connected to a high power supply voltage VDDEL. Herein, Vin is a voltage to reset the thin film transistor D-TFT, and VAR is a voltage to reset the anode of the light emitting element OLED.

The following description of the embodiment of the present disclosure is given on the assumption that a driving thin-film transistor D-TFT uses an oxide semiconductor pattern as an active layer, and a T3 thin-film transistor, which is located adjacent to the driving thin-film transistor D-TFT, uses an oxide semiconductor pattern as an active layer. Further, at least one of the remaining switching thin-film transistors for internal compensation may use a polycrystalline semiconductor pattern as an active layer. However, the present disclosure is not limited to the example illustrated in FIG. 2, and is also applicable to internal compensation circuits having any of various configurations. For example, all of the thin-film transistors included in the pixel circuit of the sub-pixel may be configured to use an oxide semiconductor as an active layer. Further, the thin-film transistor constituting the gate-driving circuit portion may also be configured to use an oxide semiconductor as an active layer.

Hereinafter, an organic light-emitting display device according to a first embodiment of the present disclosure will be described with reference to FIGS. 3 to 5B.

Figure 3:
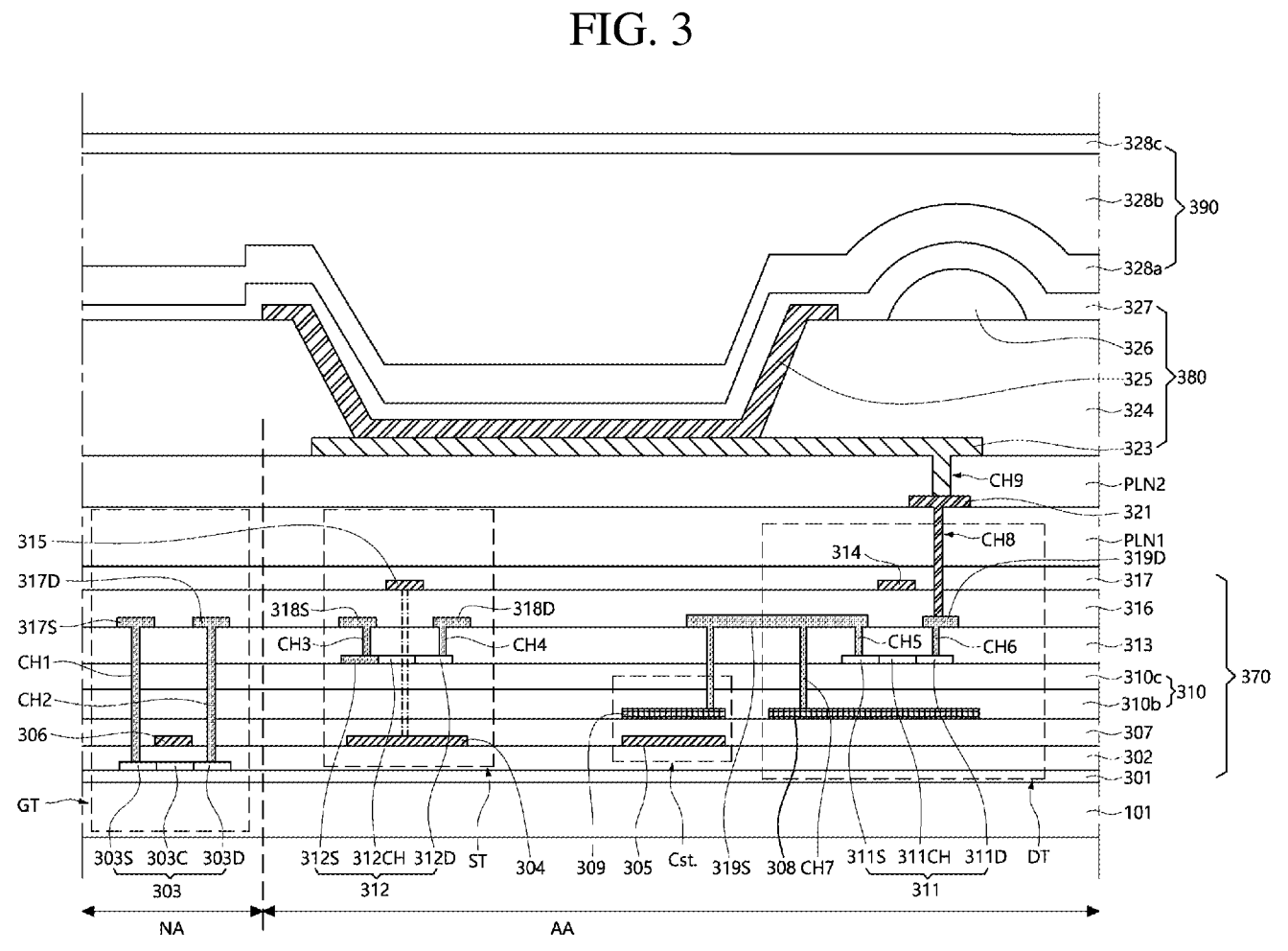
Figure 4:
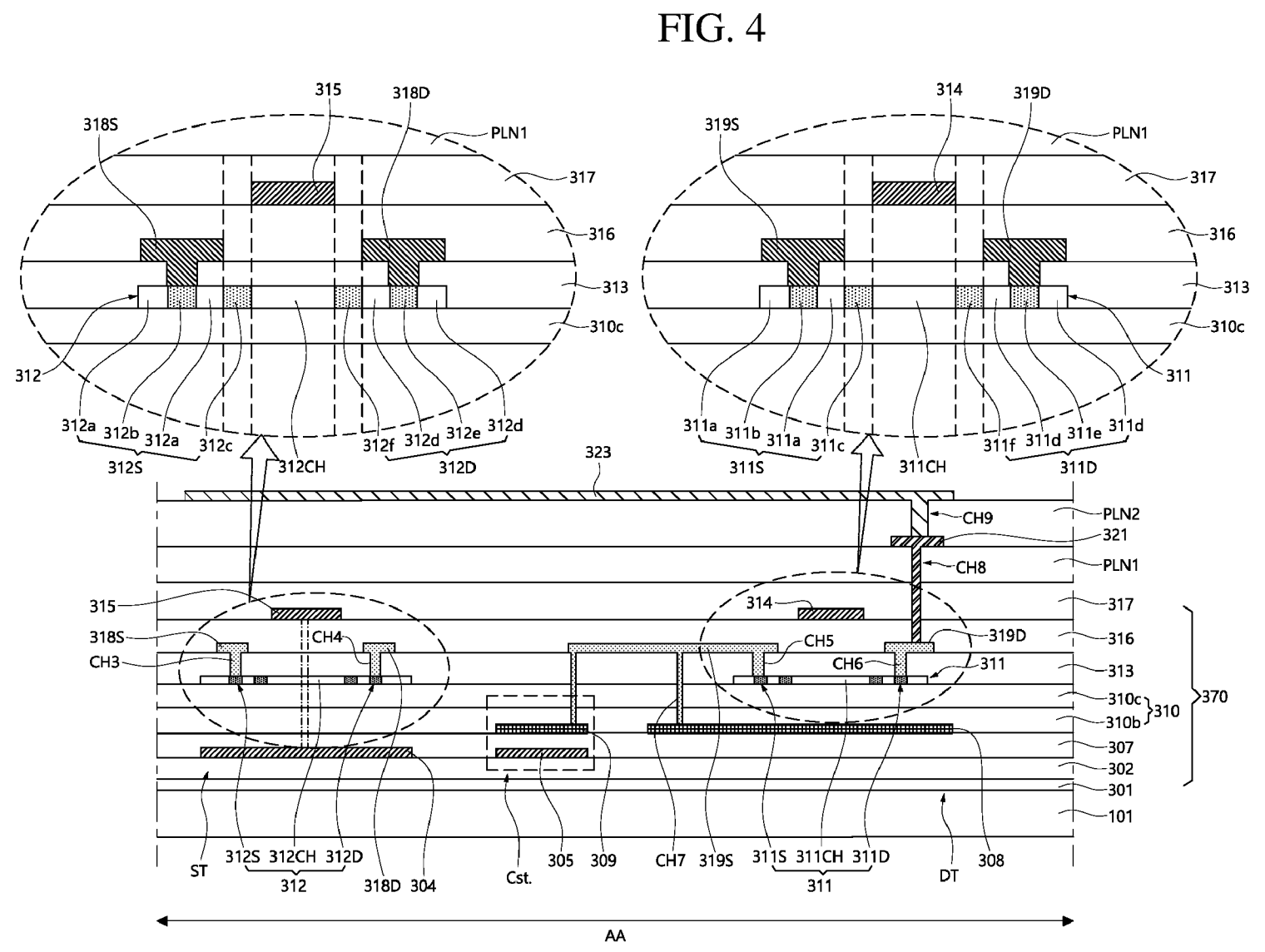
Figures 5A, 5B:
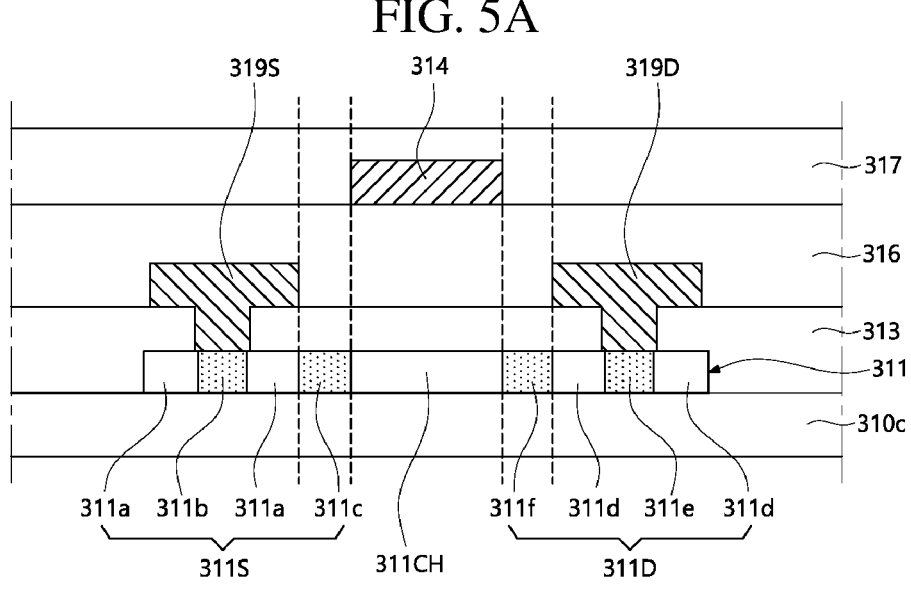
FIGS. 5A and 5B are, respectively, a cross-sectional view and a plan view showing a portion of one of the thin-film transistors shown in FIG. 4 according to the embodiment of the present disclosure.

FIG. 3 is a cross-sectional view of a configuration that includes a first gate-driving thin-film transistor GT, which is disposed in the non-display area NA, particularly, in the gate-driving unit, and uses a polycrystalline semiconductor pattern as an active layer, and that further includes a single driving thin-film transistor DT, a single switching thin-film transistor ST, and a single storage capacitor Cst, which are disposed in the sub-pixel PX. FIG. 4 is a cross-sectional view showing the driving thin-film transistor DT and the switching thin-film transistor ST shown in FIG. 3 in more detail according to one embodiment. FIG. 5A is a cross-sectional view of the switching thin-film transistor ST shown in FIG. 4, and FIG. 5B is a plan view of components of the switching thin-film transistor ST shown in FIG. 4 according to one embodiment.

Described briefly, one sub-pixel PX includes a pixel circuit portion 370, which is disposed on the substrate 101, and a light-emitting element portion 380, which is electrically connected to the pixel circuit portion 370. The pixel circuit portion 370 and the light-emitting element portion 380 are electrically insulated by planarization layers PLN1 and PLN2.

Here, the pixel circuit portion 370 refers to an array portion that includes a driving thin-film transistor DT, a switching thin-film transistor ST, and a storage capacitor Cst to drive one sub-pixel PX. Further, the light-emitting element portion 380 refers to an array portion that includes an anode 323, a cathode 327, and a light-emitting layer 325 disposed between the anode 323 and the cathode 327 to emit light.

Although the pixel circuit portion 370 is illustrated by way of example in FIG. 3 as including a single driving thin-film transistor DT, a single switching thin-film transistor ST, and a single storage capacitor Cst, the present disclosure is not limited thereto.

In particular, in one embodiment of the present disclosure, each of a driving thin-film transistor DT and at least one switching thin-film transistor ST uses an oxide semiconductor pattern as an active layer.

A thin-film transistor that uses an oxide semiconductor material as an active layer exhibits an improved leakage-current-blocking effect and incurs relatively low manufacturing costs compared to a thin-film transistor that uses a polycrystalline semiconductor material as an active layer. Therefore, in order to reduce the amount of power that is consumed and manufacturing costs, according to one embodiment of the present disclosure, an oxide semiconductor material is used to manufacture not only a driving thin-film transistor but also at least one switching thin-film transistor.

An oxide semiconductor may be made of an oxide of a metal such as zinc (Zn), indium (In), gallium (Ga), tin (Sn), or titanium (Ti), or a combination of a metal such as zinc (Zn), indium (In), gallium (Ga), tin (Sn), or titanium (Ti) and an oxide thereof. More specifically, an oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

In the pixel circuit portion constituting one sub-pixel, an oxide semiconductor material may be used to form all of the thin-film transistors, or may be used to form at least one switching thin-film transistor.

It is difficult to ensure the reliability of a thin-film transistor that uses an oxide semiconductor material, whereas a thin-film transistor that uses a polycrystalline semiconductor material exhibits a high operational speed and improved reliability. Therefore, the embodiment of the present disclosure illustrated in FIG. 3 will be described on the assumption that an oxide semiconductor material is used to manufacture one of the switching thin-film transistors and the driving thin-film transistor DT, and a polycrystalline semiconductor material is used to manufacture the thin-film transistors constituting the gate-driving unit. However, the present disclosure is not limited to the embodiment illustrated in FIG. 3. That is, all of the thin-film transistors constituting the sub-pixel may be configured to use an oxide semiconductor as an active layer, and all of the thin-film transistors constituting the gate-driving unit may be configured to use an oxide semiconductor as an active layer. Alternatively, thin-film transistors that use an oxide semiconductor as an active layer and thin-film transistors that use a polycrystalline semiconductor as an active layer may be combined to constitute the gate-driving unit.

One embodiment of the present disclosure has the purpose of reducing (for example, minimizing) the size of the thin-film transistors, which are main components of the sub-pixel, in accordance with the recent trend toward high-definition display devices, in which the number of sub-pixels disposed in each unit area is relatively large. In order to reduce (for example, minimize) the size of the thin-film transistor, it is most important to reduce the size of a semiconductor pattern including a channel region.

Reducing the size of the semiconductor pattern means reducing the size of conductive regions, which may be a channel region, a source region, and a drain region, which constitute the semiconductor pattern.

However, if the size of a channel region of a semiconductor pattern, particularly an oxide semiconductor pattern, is reduced, the value of threshold voltage Vth is converted into a negative value, which undesirably limits the operation of a thin-film transistor. Further, if the size of a channel region of the driving thin-film transistor DT, which uses an oxide semiconductor pattern as an active layer, is reduced, an s-factor value is lowered, and thus the range of drive voltage of the driving thin-film transistor DT is reduced.

Therefore, the present disclosure proposes a thin-film transistor that uses an oxide semiconductor pattern as an active layer and is capable of realizing high definition while preventing or at least reducing conversion of the Vth value into a negative value and increasing the s-factor value.

A substrate 101 may be configured as a multi-layer substrate in which an organic film and an inorganic film are alternately stacked. For example, the substrate 101 may be formed by alternately stacking an organic film such as polyimide and an inorganic film such as silicon oxide ($SiO_2$).

A lower buffer layer 301 is formed on the substrate 101. The lower buffer layer 301 serves to block or at least reduce entry of moisture or the like from the outside. The lower buffer layer 301 may be formed by stacking silicon oxide ($SiO_2$) films in multiple layers.

A second buffer layer (not shown) may be further formed on the lower buffer layer 301 in order to more assuredly protect thin-film transistors disposed in the pixel circuit portion 370 from moisture.

A first thin-film transistor GT is formed on the substrate 101 in the non-display area NA. The first thin-film transistor may use a polycrystalline semiconductor pattern as an active layer. The first thin-film transistor GT includes a first polycrystalline semiconductor pattern 303, which includes a channel through which electrons or holes move, a first gate electrode 306, a first source electrode 317S, and a first drain electrode 317D.

The first polycrystalline semiconductor pattern 303 is formed of a polycrystalline semiconductor material. The first polycrystalline semiconductor pattern 303 includes a first channel region 303C disposed in the middle thereof, and further includes a first source region 303S and a first drain region 303D, which are disposed with the first channel region 303C interposed therebetween.

The first source region 303S and the first drain region 303D are conductive regions obtained by doping an intrinsic polycrystalline semiconductor pattern with a predetermined concentration of group V or group III impurity ions, such as phosphorus (P) or boron (B).

The first channel region 303C maintains the intrinsic state of the polycrystalline semiconductor material, and provides a route along which electrons or holes move.

The first thin-film transistor GT includes a first gate electrode 306, which overlaps the first channel region 303C of the first polycrystalline semiconductor pattern 303. A first gate insulating layer 302 is interposed between the first gate electrode 306 and the first polycrystalline semiconductor pattern 303.

According to an embodiment of the present disclosure, the first thin-film transistor GT is of a top-gate type in which the first gate electrode 306 is located above the first polycrystalline semiconductor pattern 303. Accordingly, a first storage capacitor electrode 305 and a second light-blocking pattern 304, which are formed of a first gate electrode material, may be formed through a single mask process, thus reducing the number of mask processes.

The first gate electrode 306 is made of a metal material. For example, the first gate electrode 306 may take the form of a single layer or multiple layers made of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

A first interlayer insulating layer 307 is deposited on the first gate electrode 306. The first interlayer insulating layer 307 may be formed of silicon nitride (SiNx). Particularly, the first interlayer insulating layer 307, which is formed of silicon nitride (SiNx), may contain hydrogen particles. When a heat treatment process is performed after forming the first channel region 303C and depositing the first interlayer insulating layer 307 thereon, the hydrogen particles contained in the first interlayer insulating layer 307 permeate the first source region 303S and the first drain region 303D, whereby the polycrystalline semiconductor material is made to be conductive. This may be called a hydrogenation process, which is a process in which source and drain regions are made conductive through a contact method.

The first thin-film transistor GT may further include an upper buffer layer 310 and a second gate insulating layer 313, which are sequentially formed on the first interlayer insulating layer 307. The first source electrode 317S and the first drain electrode 317D may be formed on the second gate insulating layer 313, and may be respectively connected to the first source region 303S and to the first drain region 303D.

The upper buffer layer 310 isolates the first polycrystalline semiconductor pattern 303 from a first oxide semiconductor pattern 311 of the driving thin-film transistor DT, which is formed of an oxide semiconductor material, and a second oxide semiconductor pattern 312 of the first switching thin-film transistor ST, which is formed of an oxide semiconductor material. Further, the upper buffer layer 310 provides a base on which the first oxide semiconductor pattern 311 and the second oxide semiconductor pattern 312 are formed.

The second gate insulating layer 313 is an insulating layer that covers the first oxide semiconductor pattern 311 of the driving thin-film transistor DT and the second oxide semiconductor pattern 312 of the first switching thin-film transistor ST. Since the second gate insulating layer 313 is formed on the first oxide semiconductor pattern 311 and the second oxide semiconductor pattern 312, the second gate insulating layer 313 may be configured as an inorganic film that does not contain hydrogen particles.

Each of the first source electrode 317S and the first drain electrode 317D may take the form of a single layer or multiple layers made of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

The driving thin-film transistor DT is formed on the upper buffer layer 310.

According to an embodiment of the present disclosure, the driving thin-film transistor DT includes the first oxide semiconductor pattern 311.

In a conventional driving thin-film transistor, a polycrystalline semiconductor pattern, which is advantageous from the aspect of high-speed operation, is used as an active layer. However, the conventional driving thin-film transistor, which includes the polycrystalline semiconductor pattern, has a problem in that leakage current is generated in an off state, and thus a large amount of power is consumed. Therefore, the embodiment of the present disclosure proposes a driving thin-film transistor DT that uses an oxide semiconductor pattern as an active layer, which is advantageous from the aspect of prevention or at least a reduction of generation of leakage current.

However, in the case of a thin-film transistor that uses an oxide semiconductor pattern as an active layer, a current fluctuation value with respect to a unit voltage fluctuation value is large due to the characteristics of an oxide semiconductor material, and thus defects frequently occur in a region of low grayscale values, in which precise current control is required. Therefore, the embodiment of the present disclosure provides a driving thin-film transistor in which fluctuation in the value of current in an active layer is relatively insensitive to fluctuation in the value of voltage applied to a gate electrode. Further, the embodiment of the present disclosure provides a driving thin-film transistor that has a relatively small channel region and a relatively high s-factor value in order to realize high definition.

Referring to FIGS. 4, 5A, and 5B, the driving thin-film transistor DT includes a first oxide semiconductor pattern 311 formed on the upper buffer layer 310, and further includes a second source electrode 319S and a second drain electrode 319D, which are electrically connected to the first oxide semiconductor pattern 311, and a second gate electrode 314, which overlaps the first oxide semiconductor pattern 311.

The second gate insulating layer 313 is interposed between the first oxide semiconductor pattern 311 and each of the second source electrode 319S and the second drain electrode 319D. That is, the second gate insulating layer 313 covers the first oxide semiconductor pattern 311, and the second source electrode 319S and the second drain electrode 319D are disposed on the second gate insulating layer 313.

Further, in one embodiment of the present disclosure, the second gate electrode 314 is formed on a second interlayer insulating layer 316, which covers the second source electrode 319S and the second drain electrode 319D, and overlaps the first oxide semiconductor pattern 311. Therefore, the second gate insulating layer 313 and the second interlayer insulating layer 316 are interposed between the second gate electrode 314 and the first oxide semiconductor pattern 311. Further, the second gate electrode 314 is disposed on an insulating layer that is located on the second source electrode 319S and the second drain electrode 319D.

The first oxide semiconductor pattern 311 includes a second channel region 311CH, through which carriers move, and further includes a second source region 311S and a second drain region 311D, which are disposed with the second channel region 311CH interposed therebetween.

The second channel region 311CH is a region of the first oxide semiconductor pattern 311 that overlaps the second gate electrode 314. Therefore, in order to reduce the size of the driving thin-film transistor DT, it is required to reduce the width of the second channel region 311CH by reducing the line width of the second gate electrode 314.

The second source region 311S is provided with a plurality of conductive regions 311b and 311c, which are made to be conductive by injecting impurity ions thereinto, and the second drain region 311D is provided with a plurality of conductive regions 311f and 311e, which are made to be conductive by injecting impurity ions thereinto. Further, non-conductive regions 311a and 311d, which are not injected with impurity ions, are respectively disposed between the conductive regions 311b and 311c and between the conductive regions 311f and 311e.

The conductive regions and the non-conductive regions may be alternately disposed. It should be noted that, from the above, a "non-conductive region" may refer to a region with a conductivity less than that of the conductive regions herein. For example, the non-conductive region may be an undoped intrinsic region.

Specifically, the second source region 311S may be formed such that the non-conductive region 311a, the first conductive region 311b, the non-conductive region 311a, and the second conductive region 311c are sequentially disposed adjacent to each other. Similarly, the second drain region 311D may be formed such that the non-conductive region 311d, the first conductive region 311e, the non-conductive region 311d, and the second conductive region 311f are sequentially disposed adjacent to each other. Further, the second conductive regions 311c and 311f are disposed adjacent to the second channel region 311CH.

The non-conductive regions 311a and 311d included in the second source region 311S and the second drain region 311D serve as channel regions, thus exhibiting an effect of substantially increasing the length of the second channel region 311CH.

Therefore, in the driving thin-film transistor DT according to the embodiment of the present disclosure, since the non-conductive regions 311a and 311d included in the second source region 311S and the second drain region 311D serve as channel regions, it may be possible to realize a driving thin-film transistor DT having a smaller size by reducing the length of the second channel region 311CH.

Referring to FIG. 5B, the first conductive region 311*b* of the second source region 311S may be a region that is in contact with the second source electrode 319S. The first conductive region 311*e* of the second drain region 311D may be a region that is in contact with the second drain electrode 319D. The areas of the first conductive regions 311*b* and 311*e* may respectively be greater than the contact area between the second source electrode 319S and the second source region 311S and the contact area between the second drain electrode 319D and the second drain region 311D. The reason for this is that the first conductive regions 311*b* and 311*e* are made to be conductive by bringing the second source region 311S and the second drain region 311D into contact with impurity ions, at which time the impurity ions diffuse in certain portions of the second source region 311S and the second drain region 311D. As a result, the areas of the first conductive regions 311*b* and 311*e* may respectively be greater than the contact area between the second source electrode 319S and the second source region 311S and the contact area between the second drain electrode 319D and the second drain region 311D.

Figure 9A:
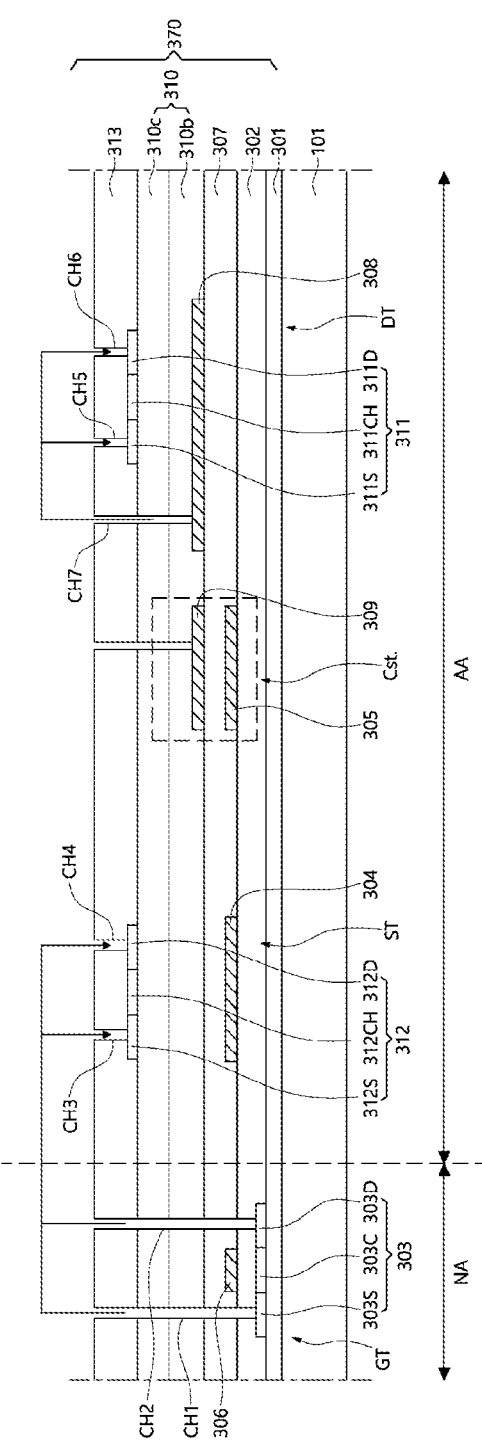
FIGS. 9A and 9B are cross-sectional views for explaining main portions in a manufacturing process according to an embodiment of the present disclosure.

Hereinafter, a process of forming the first conductive regions 311*b* and 311*e* according to the embodiment of the present disclosure will be described in more detail with reference to FIG. 9A.

The first oxide semiconductor pattern 311 is formed on the upper buffer layer 310, and then the second gate insulating layer 313, which electrically insulates the first oxide semiconductor pattern 311, is deposited on the first oxide semiconductor pattern 311. If the first oxide semiconductor pattern 311 comes into contact with hydrogen particles, oxygen vacancies contained in the first oxide semiconductor pattern 311 are combined with the hydrogen particles, and thus the first oxide semiconductor pattern 311 becomes conductive. Therefore, the second gate insulating layer 313 may be formed of silicon oxide ($SiO_2$), which does not contain hydrogen particles.

A fifth contact hole CH5 and a sixth contact hole CH6 are formed in the second gate insulating layer 313 in order to respectively expose the second source region 311S and the second drain region 311D.

In addition to the fifth contact hole CH5 and the sixth contact hole CH6, a seventh contact hole CH7, which exposes the upper surface of a first light-blocking pattern 308 disposed below the first oxide semiconductor pattern 311 to shield the first oxide semiconductor pattern 311 from light, third and fourth contact holes CH3 and CH4, which respectively expose a portion of the third source region 312S and a portion of the third drain region 312D of the second oxide semiconductor pattern 312, and first and second contact holes CH1 and CH2, which respectively expose a portion of the first source region 303S and a portion of the first drain region 303D of the first thin-film transistor GT disposed in the non-display area NA, are simultaneously formed. In this case, hydrogen particles are generated in a first interlayer insulating layer 302, which is formed on the first polycrystalline semiconductor pattern 303 and contains hydrogen particles, and a second sub-upper buffer layer 310*b*, which is formed on the first light-blocking pattern 308 and contains hydrogen particles. The generated hydrogen particles come into contact with the first oxide semiconductor pattern 311, thereby forming the first conductive regions 311*b* and 311*e*.

The second conductive region 311*c* of the second source region 311S may be the portion of the second source region 311S that is located between the second gate electrode 314 and the second source electrode 319S. Further, the second conductive region 311*f* of the second drain region 311D may be the portion of the second drain region 311D that is located between the second gate electrode 314 and the second drain electrode 319D. Therefore, an end of the second source electrode 319S and an end of the second drain electrode 319D may be spaced apart from respective ends of the second gate electrode 314.

Figure 9B:
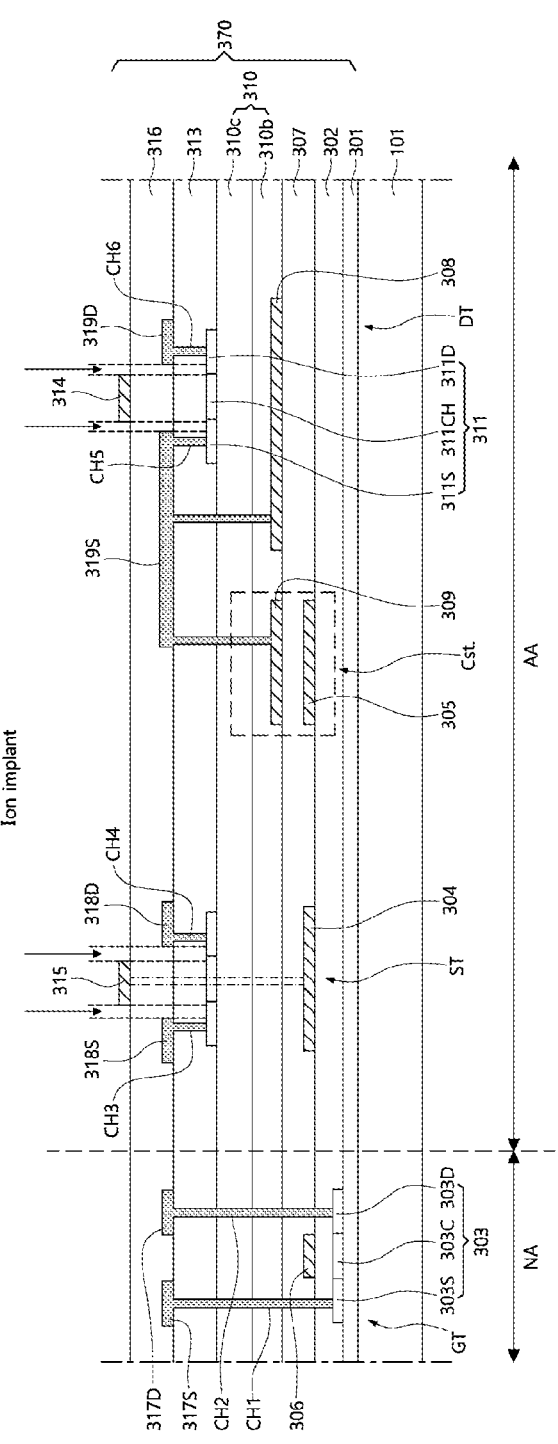

Hereinafter, a process of forming the second conductive regions 311*c* and 311*f* will be described with reference to FIG. 9B.

After the second source electrode 319S and the second drain electrode 319D are formed, a second interlayer insulating layer 316 is formed so as to cover the second source electrode 319S and the second drain electrode 319D. The second gate electrode 314 is formed on the second interlayer insulating layer 316.

The second gate electrode 314 is disposed so as to overlap the first oxide semiconductor pattern 311, and the overlapping region of the first oxide semiconductor pattern 311 becomes the second channel region 311CH.

As shown in FIG. 5A, the second gate electrode 314 and the second source electrode 319S are spaced a predetermined distance apart from each other. Further, as shown in FIG. 5A, the second gate electrode 314 and the second drain electrode 319D are spaced a predetermined distance apart from each other. Impurity ions, for example group III or group V ions, such as boron (B) or phosphorus (P), are injected in an ion implantation manner. At this time, the second gate electrode 314, the second source electrode 319S, and the second drain electrode 319D serve as a mask for the injected ions, whereby the second conductive regions 311*c* and 311*f* are formed. Therefore, the second conductive regions 311*c* and 311*f* are formed through an ion implantation method, unlike the first conductive regions 311*b* and 311*e*.

In addition, the driving thin-film transistor DT further includes a first light-blocking pattern 308, which is inserted into the upper buffer layer 310 so as to overlap the first oxide semiconductor pattern 311.

Substantially, the first light-blocking pattern 308 may be inserted into the upper buffer layer 310. In one embodiment of the present disclosure, a plurality of sub-upper buffer layers is provided. That is, in the upper buffer layer 310, a second sub-upper buffer layer 310*b* and a third sub-upper buffer layer 310*c* may be sequentially stacked. Alternatively, in the upper buffer layer 310, a first sub-upper buffer layer (not shown in FIG. 3), a second sub-upper buffer layer 310*b*, and a third sub-upper buffer layer 310*c* may be sequentially stacked.

Referring to FIG. 3, the first light-blocking pattern 308 is disposed on the first interlayer insulating layer 307. In addition, the second sub-upper buffer layer 310*b* completely covers the top of the first light-blocking pattern 308, and the third sub-upper buffer layer 310*c* is formed on the second sub-upper buffer layer 310*b*.

The first sub-upper buffer layer and the third sub-upper buffer layer 310*c* may be formed of silicon oxide ($SiO_2$).

The first sub-upper buffer layer and the third sub-upper buffer layer 310*c* are made of silicon oxide ($SiO_2$), which does not contain hydrogen particles, thereby protecting the oxide semiconductor pattern, the reliability of which may be deteriorated due to permeation of hydrogen particles during a heat treatment process.

The second sub-upper buffer layer 310*b* may be made of silicon nitride (SiNx), having excellent ability to trap hydrogen particles. The second sub-upper buffer layer 310*b* may be formed on a portion of the first sub-upper buffer layer so as to cover both the upper surface and the side surface of the first light-blocking pattern 308 to thus completely seal the first light-blocking pattern 308. Alternatively, the second sub-upper buffer layer 310*b* may be formed on the entire surface of the first sub-upper buffer layer on which the first light-blocking pattern 308 is formed. Silicon nitride (SiNx) has better ability to trap hydrogen particles than silicon oxide (SiO₂). That is, when a hydrogenation process of introducing hydrogen particles into the first polycrystalline semiconductor pattern 303 of the first thin-film transistor GT is performed, the second sub-upper buffer layer 310*b*, including silicon nitride, traps hydrogen particles generated in the first interlayer insulating layer 307, thereby protecting oxide semiconductor patterns formed thereon from the hydrogen particles. When hydrogen particles permeate the oxide semiconductor pattern, there occurs a problem in which oxide semiconductors have different threshold voltages or different channel conductivities depending on the formation positions thereof.

In particular, it is important to ensure the reliability of the driving thin-film transistor, since the driving thin-film transistor directly contributes to the operation of the light-emitting element.

Therefore, in the embodiment of the present disclosure, since the second sub-upper buffer layer 310*b* is formed so as to cover the first light-blocking pattern 308, it may be possible to prevent or at least reduce deterioration in the reliability of the driving thin-film transistor DT due to hydrogen particles.

In addition, in the embodiment of the present disclosure, the first light-blocking pattern 308 may be formed as a metal layer including a titanium (Ti) material, which has excellent ability to trap hydrogen particles. For example, the metal layer may be a single layer of titanium, multiple layers of molybdenum (Mo) and titanium (Ti), or an alloy of molybdenum (Mo) and titanium (Ti). However, the present disclosure is not limited thereto, and any other metal layer including titanium (Ti) may be adopted.

Titanium (Ti) traps hydrogen particles diffusing in the upper buffer layer 310 to prevent the hydrogen particles from reaching the first oxide semiconductor pattern 311. Therefore, in the driving thin-film transistor DT according to the embodiment of the present disclosure, the first light-blocking pattern 308 is formed as a layer of metal such as titanium, having the ability to trap hydrogen particles, and is covered with a silicon nitride (SiNx) layer, having the ability to trap hydrogen particles, so that it is possible to alleviate the problem in which the reliability of the oxide semiconductor pattern is deteriorated by hydrogen particles.

The second sub-upper buffer layer 310*b* including silicon nitride (SiNx) may selectively cover only the first light-blocking pattern 308.

The second sub-upper buffer layer 310*b* is formed of a material different from that of the first sub-upper buffer layer. That is, the second sub-upper buffer layer 310*b* is formed as a silicon nitride (SiNx) film. Thus, when the second sub-upper buffer layer 310*b* is deposited on the entire surface of the display area, film lifting may occur. To address this problem, the second sub-upper buffer layer 310*b* may be selectively formed only on a necessary portion, that is, only at a position where the first light-blocking pattern 308 is formed.

In one embodiment, the first light-blocking pattern 308 and the second sub-upper buffer layer 310*b* are formed vertically below the first oxide semiconductor pattern 311 so as to overlap the first oxide semiconductor pattern 311, from the aspect of the functionality thereof. Further, the first light-blocking pattern 308 may be formed to be larger than the first oxide semiconductor pattern 311 so as to completely overlap the first oxide semiconductor pattern 311.

Meanwhile, the second source electrode 319S of the driving thin-film transistor DT may be electrically connected to the first light-blocking pattern 308.

As described above, when the first light-blocking pattern 308 is inserted into the upper buffer layer 310 and the second source electrode 319S is electrically connected to the first light-blocking pattern 308, the following additional effect may be obtained.

This will be described with reference to FIGS. 8A and 8B.

Figure 8A:
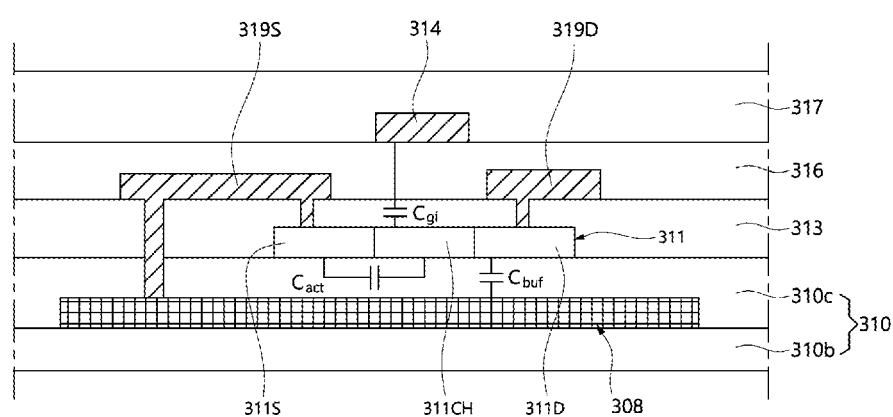
FIG. 8A is a cross-sectional view showing the relationship between parasitic capacitances generated in the driving thin-film transistor shown in FIG. 7 according to the other embodiment of the present disclosure.
Figure 8B:
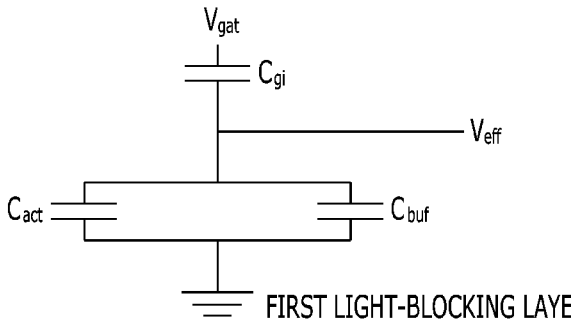
FIG. 8B is a circuit diagram of FIG. 8A according to the other embodiment of the present disclosure.

FIG. 8A is a cross-sectional view of the driving thin-film transistor DT, among the components shown in FIG. 3 according to one embodiment. FIG. 8B is a circuit diagram showing the relationship between the parasitic capacitance generated in the driving thin-film transistor DT and voltage applied thereto according to one embodiment.

Referring to FIG. 8A, since the second source region 311S and the second drain region 311D are made to be conductive, a parasitic capacitance $C_{act}$ is generated inside the first oxide semiconductor pattern 311, a parasitic capacitance $C_{gi}$ is generated between the second gate electrode 314 and the first oxide semiconductor pattern 311, and a parasitic capacitance $C_{buf}$ is generated between the first light-blocking pattern 308, which is electrically connected to the second source electrode 319S, and the first oxide semiconductor pattern 311.

The first oxide semiconductor pattern 311 and the first light-blocking pattern 308 are electrically connected to each other via the second source electrode 319S, and thus the parasitic capacitance $C_{act}$ and the parasitic capacitance $C_{buf}$ are connected in parallel to each other, and the parasitic capacitance $C_{act}$ and the parasitic capacitance $C_{gi}$ are connected in series to each other. In addition, when a gate voltage of $V_{gat}$ ($\Delta V_{gat}$) is applied to the second gate electrode 314, the effective voltage $V_{eff}$ ($\Delta V$) that is actually applied to the first oxide semiconductor pattern 311 satisfies the following Equation 1.

$$\Delta V = Cgi/(Cgi + Cact + Cbuf) \times \Delta Vgat \qquad \text{[Equation 1]}$$

Accordingly, the effective voltage applied to the channel of the first oxide semiconductor pattern 311 is inversely proportional to the parasitic capacitance $C_{buf}$, and thus the effective voltage applied to the first oxide semiconductor pattern 311 may be adjusted by adjusting the parasitic capacitance $C_{buf}$.

That is, when the first light-blocking pattern 308 is disposed close to the first oxide semiconductor pattern 311 to increase the parasitic capacitance $C_{buf}$, the actual value of the current flowing through the first oxide semiconductor pattern 311 may be reduced.

The reduction in the effective value of the current flowing through the first oxide semiconductor pattern 311 means that the range within which it is possible to control the driving thin-film transistor DT using the voltage $V_{gat}$ that is actually applied to the second gate electrode 314 is widened.

The effective voltage Veff may be adjusted by a ratio of the parasitic capacitance Cbuf and the parasitic capacitance Cgi. Therefore, in the embodiment of the present disclosure illustrated in FIG. 3, the parasitic capacitance Cbuf is greater than the parasitic capacitance Cgi by the first light-blocking pattern 308 being disposed relatively close to the first oxide semiconductor pattern 311, thereby widening the range of grayscale values within which the driving thin-film transistor DT is capable of performing control. As a result, the light-emitting element may be precisely controlled even at low grayscale values, and thus it may be possible to solve a problem of non-uniform luminance, which frequently occurs at low grayscale values.

The first switching thin-film transistor ST includes a second oxide semiconductor pattern 312 formed on the upper buffer layer 310, a second gate insulating layer 313 covering the second oxide semiconductor pattern 312, third source and drain electrodes 318S and 318D formed on the second gate insulating layer 313, a second interlayer insulating layer 316 formed on the third source and drain electrodes 318S and 318D, and a third gate electrode 315 formed on the second interlayer insulating layer 316.

The first switching thin-film transistor ST according to an embodiment of the present disclosure has a configuration that is generally similar to that of the driving thin-film transistor DT. However, the first switching thin-film transistor ST has a smaller size than the driving thin-film transistor DT. For example, the driving thin-film transistor DT may have a channel length of 7 μm, and the first switching thin-film transistor ST may have a channel length of 3 μm.

As the size of the channel of the switching thin-film transistor ST decreases, the amount of power that is consumed decreases. When the components of the present disclosure, that is, the source region and the drain region, are configured such that conductive regions and non-conductive regions are alternately disposed, the effective length of the channel of the switching thin-film transistor ST may increase although the actual size of the channel remains constant. Therefore, when the embodiment of the present disclosure is designed to consume the same amount of power as a conventional device, it may be possible to reduce the length of the channel.

The second oxide semiconductor pattern 312 includes a third channel region 312CH, through which carriers move, and further includes a third source region 312S and a third drain region 312D, which are disposed with the third channel region 312CH interposed therebetween.

The third channel region 312CH is a region of the second oxide semiconductor pattern 312 that overlaps the third gate electrode 315. Therefore, in order to reduce the size of the first switching thin-film transistor ST, it is required to reduce the width of the third channel region 312CH by reducing the line width of the third gate electrode 315.

The third source region 312S is provided with a plurality of conductive regions 312b and 312c, which are made to be conductive by injecting impurity ions thereinto, and the third drain region 312D is provided with a plurality of conductive regions 312f and 312e, which are made to be conductive by injecting impurity ions thereinto. Further, non-conductive regions 312a and 312d, which are not injected with impurity ions, are respectively disposed between the conductive regions 312b and 312c and between the conductive regions 312f and 312e.

The conductive regions and the non-conductive regions may be alternately disposed.

Specifically, the third source region 312S may be formed such that the non-conductive region 312a, the third conductive region 312b, the non-conductive region 312a, and the fourth conductive region 312c are sequentially disposed adjacent to each other. Similarly, the third drain region 312D may be formed such that the non-conductive region 312d, the third conductive region 312e, the non-conductive region 312d, and the fourth conductive region 312f are sequentially disposed adjacent to each other. Further, the fourth conductive regions 312c and 312f are disposed adjacent to the third channel region 312CH.

The non-conductive regions 312a and 312d included in the third source region 312S and the third drain region 312D serve as channel regions, thus exhibiting an effect of substantially increasing the length of the third channel region 312CH.

Therefore, in the first switching thin-film transistor ST according to the embodiment of the present disclosure, since the non-conductive regions 312a and 312d included in the third source region 312S and the third drain region 312D serve as channel regions, it may be possible to realize a first switching thin-film transistor ST having a smaller size by reducing the length of the third channel region 312CH.

The configuration of the driving thin-film transistor DT illustrated in FIG. 5B is substantially the same as the configuration of the first switching thin-film transistor ST.

The first switching thin-film transistor ST may further include a second light-blocking pattern 304, which is disposed below the second oxide semiconductor pattern 312 so as to overlap the same. Particularly, the second light-blocking pattern 304 may be made of the same material as the first gate electrode 306, and may be formed on the upper surface of the first gate insulating layer 302. The second light-blocking pattern 304 may not be an essential component. That is, in some cases, the second light-blocking pattern 304 may be omitted from the first switching thin-film transistor ST.

Alternatively, the second light-blocking pattern 304 may be formed on the same layer and of the same material as a second storage capacitor electrode 309, rather than being formed on the same layer and of the same material as the first gate electrode 306. That is, when one sub-pixel PX is provided with a plurality of switching thin-film transistors, the plurality of switching thin-film transistors may be respectively provided with second light-blocking patterns 304 in different layers, thus increasing design freedom.

Although the second light-blocking pattern 304 is illustrated in FIG. 3 as not being electrically connected to the third gate electrode 315, the second light-blocking pattern 304 may be electrically connected to the third gate electrode 315 to form a dual gate. Since the first switching thin-film transistor ST has a dual-gate structure, it may be possible to more precisely control the flow of current flowing through the third channel region 312C, to reduce the overall size of the display device, and to realize a high-definition display device.

The second oxide semiconductor pattern 312 is made of an oxide semiconductor material, and includes a third channel region 312CH, which maintains the intrinsic state of the oxide semiconductor material rather than being doped with impurities, and a third source region 312S and a third drain region 312D, in which conductive regions, into which impurities are injected, and non-conductive regions, into which impurities are not injected, are combined.

Similar to the first source and drain electrodes 317S and 317D and the second source and drain electrodes 319S and 319D, each of the third source electrode 318S and the third drain electrode 318D may take the form of a single layer or multiple layers made of molybdenum (Mo), aluminum (Al), chromium (Cr), gold (Au), titanium (Ti), nickel (Ni), neodymium (Nd), copper (Cu), or an alloy thereof.

The third source and drain electrodes 318S and 318D are formed on the second gate insulating layer 313 simultaneously with and of the same material as the first source and drain electrodes 317S and 317D and the second source and drain electrodes 319S and 319D, thus making it possible to reduce the number of mask processes.

Meanwhile, referring to FIG. 3, the pixel circuit portion 370 according to the embodiment of the present disclosure further includes the storage capacitor Cst.

The storage capacitor Cst stores a data voltage applied thereto through the data lines for a designated period of time, and then provides the data voltage to the light-emitting element.

The storage capacitor Cst includes two electrodes corresponding to each other and a dielectric disposed therebetween. The storage capacitor Cst includes a first storage capacitor electrode 305, which is made of the same material as and is disposed on the same layer as the first gate electrode 306, and a second storage capacitor electrode 309, which is made of the same material as and is disposed on the same layer as the first light-blocking pattern 308.

The first interlayer insulating layer 307 is located between the first storage capacitor electrode 305 and the second storage capacitor electrode 309.

The second storage capacitor electrode 309 of the storage capacitor Cst may be electrically connected to the second source electrode 319S.

Next, an organic light-emitting display device according to a second embodiment of the present disclosure will be described with reference to FIG. 6. Components of the second embodiment of the present disclosure, other than the second gate electrode 314 and the third gate electrode 315, are the same as those of the first embodiment.

Figure 6:
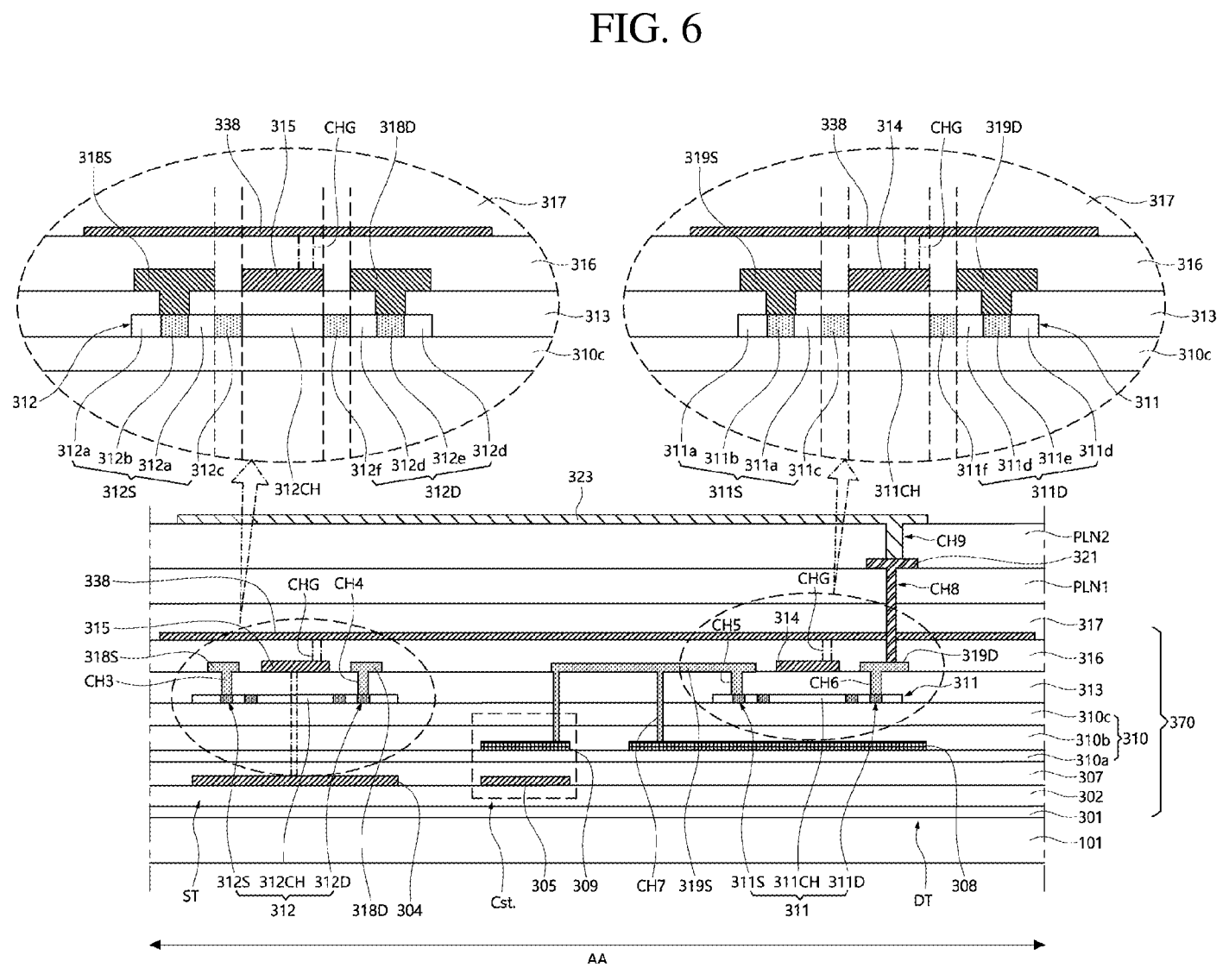

Referring to FIG. 6, in the second embodiment, the second gate electrode 314 and the third gate electrode 315 are formed on the same layer as the second source electrode 319S and the second drain electrode 319D. The second gate electrode 314 is disposed between the second source electrode 319S and the second drain electrode 319D. The third source electrode 318S and the third drain electrode 318D are disposed on the same layer as the second gate electrode 314 and the third gate electrode 315.

The second gate electrode 314 and the third gate electrode 315 are formed simultaneously with and of the same material as each other. However, the second gate electrode 314 and the third gate electrode 315 may be formed of the same material as or different materials from the second source electrode 319S and the third source electrode 318S.

Since the second gate electrode 314, the second source electrode 319S, and the third source electrode 318S are disposed on the same layer, a gate line 338, which applies a gate voltage to the second gate electrode 314, and a data line (not shown), which applies a source voltage to the second source electrode 319S and the third source electrode 318S, need to be located in different layers. Gate lines and data lines are disposed so as to intersect each other to define sub-pixels, and thus need to be formed in different layers in order to prevent the occurrence of a short circuit when the gate lines and the data lines intersect each other. Therefore, in the second embodiment of the present disclosure illustrated in FIG. 6, the gate line 338 may be disposed on the second interlayer insulating layer 316, and may be connected to the second gate electrode 314 and the third gate electrode 315 through contact holes CHG.

In the case in which the gate line 338 is formed on the second interlayer insulating layer 316, the gate line 338 may be covered with a third interlayer insulating layer 317 in order to electrically insulate the gate line 338 from the outside.

In the second embodiment, the upper buffer layer 310 is illustrated as having a three-layer structure. That is, the upper buffer layer 310 may be formed such that the first sub-upper buffer layer 310a, the second sub-upper buffer layer 310b, and the third sub-upper buffer layer 310c are sequentially stacked. Particularly, the second sub-upper buffer layer 310b may include silicon nitride (SiNx), having excellent ability to trap hydrogen particles. The first sub-upper buffer layer 310a and the third sub-upper buffer layer 310c may be silicon oxide ($SiO_2$) layers, which do not contain hydrogen particles.

The first light-blocking pattern 308 is disposed on the second sub-upper buffer layer 310b.

Although the upper buffer layer 310 is described in the second embodiment as having a structure in which three sub-upper buffer layers are stacked, this structure of the upper buffer layer 310 is also applicable to the first embodiment.

Figure 7:
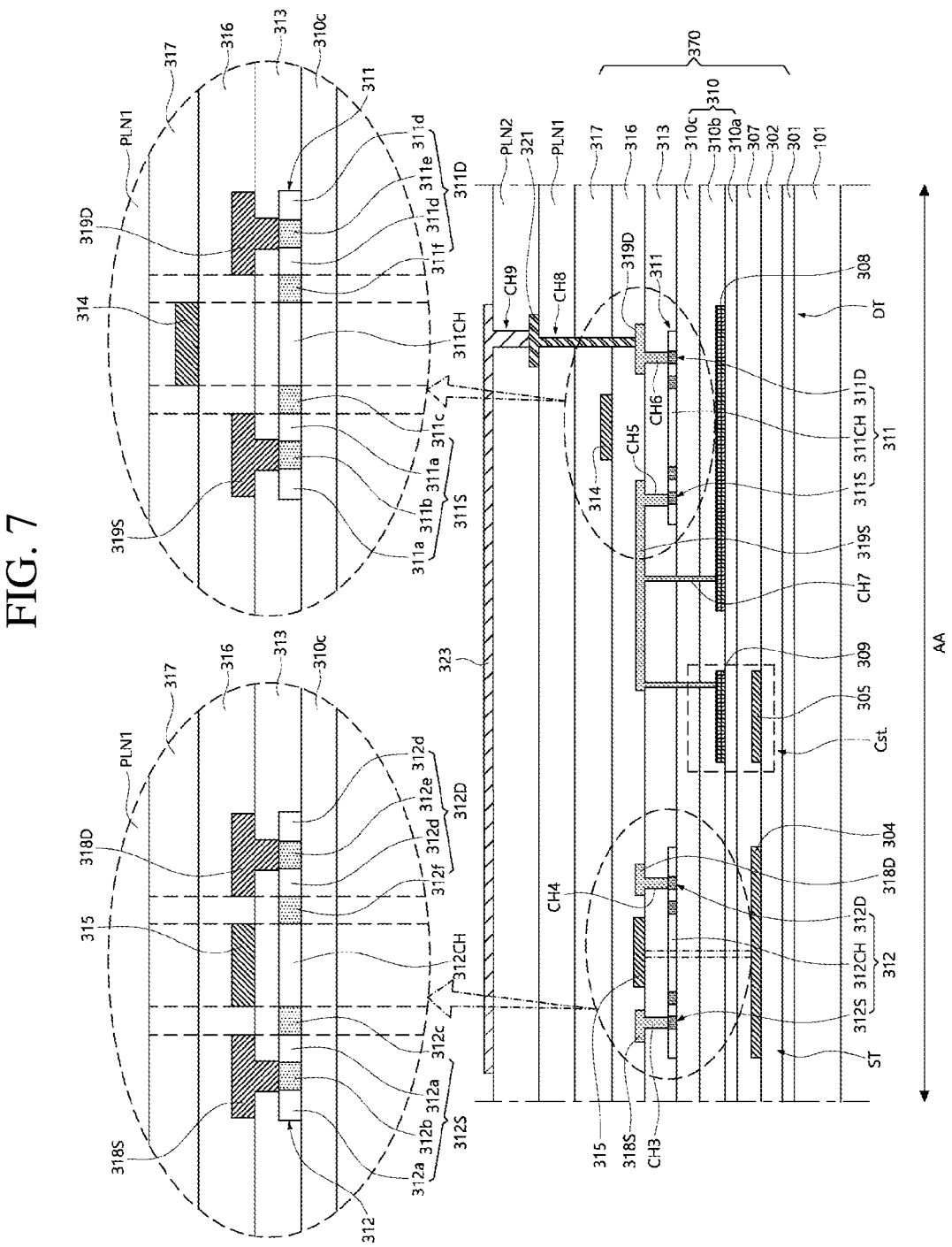
FIG. 7 is a cross-sectional view of a driving thin-film transistor and a switching thin-film transistor in a pixel area according to still another embodiment of the present disclosure.

Next, a third embodiment of the present disclosure will be described with reference to FIG. 7.

The third embodiment is the same as the first embodiment, except for the positions of the second gate electrode 314, the third gate electrode 315, and the first light-blocking pattern 308.

As described above, referring to Equation 1 and FIG. 8A, as the distance (for example, a vertical distance in a direction in perpendicular to a surface of the substrate 101) from the first oxide semiconductor pattern 311 to the first light-blocking pattern 308 decreases, the $C_{buf}$ value increases, and the value of the effective voltage $V_{eff}$ ($\Delta V$) decreases.

$$\Delta V = Cgi/(Cgi + Cact + Cbuf) \times \Delta Vgat \qquad \text{[Equation 1]}$$

As the distance (for example, a vertical distance in a direction in perpendicular to the surface of the substrate 101) from the first oxide semiconductor pattern 311 to the second gate electrode 314 increases, the $C_{gi}$ value decreases, and the value of the effective voltage $V_{eff}$ decreases. That is, when the $C_{buf}$ value increases and the $C_{gi}$ value decreases, the $V_{eff}$ value may greatly decrease. Reducing the $V_{eff}$ value means increasing the range of voltage that can be actually applied to the gate electrode to control the same. That is, the s-factor value of the driving thin-film transistor DT may increase.

The first switching thin-film transistor ST is required to have a high operational speed. In order to increase the operational speed of the first switching thin-film transistor ST, it is necessary to reduce the distance (for example, a vertical distance in a direction in perpendicular to the surface of the substrate 101) between the second oxide semiconductor pattern 312 and the third gate electrode 315. Therefore, in the third embodiment of the present disclosure, the second gate electrode 314 is disposed on the second interlayer insulating layer 316, the third gate electrode 315 is disposed on the second gate insulating layer 313, and the first light-blocking pattern 308 is disposed on the second sub-upper buffer layer 310b. As a result, the s-factor value of the driving thin-film transistor DT increases, and the operational speed of the first switching thin-film transistor ST increases, thereby realizing the highly efficient pixel circuit portion of the sub-pixel.

In addition, referring to FIG. 3, a first planarization layer PLN1 and a second planarization layer PLN2 may be sequentially formed on the pixel circuit portion 370 in order to planarize the upper end of the pixel circuit portion 370. The light-emitting element portion 380 includes a first electrode 323, which is an anode, a second electrode 327, which is a cathode corresponding to the first electrode 323, and a light-emitting layer 325, which is interposed between the first electrode 323 and the second electrode 327. The first electrode 323 is formed in each sub-pixel.

The light-emitting element portion 380 is connected to the pixel circuit portion 370 via a connection electrode 321, which is formed on the first planarization layer PLN1. Particularly, the first electrode 323 of the light-emitting element portion 380 and the second drain electrode 319D of the driving thin-film transistor DT constituting the pixel circuit portion 370 are connected to each other via the connection electrode 321.

The first electrode 323 is connected to the connection electrode 321, which is exposed through a contact hole CH9 formed through the second planarization layer PLN2. Further, the connection electrode 321 is connected to the second drain electrode 319D, which is exposed through a contact hole CH8 formed through the first planarization layer PLN1.

The first electrode 323 may be formed in a multi-layer structure including a transparent conductive film and an opaque conductive film having high reflection efficiency. The transparent conductive film may be formed of a material having a relatively high work function, e.g., indium-tin-oxide (ITO) or indium-zinc-oxide (IZO), and the opaque conductive film may be formed in a single-layer or multi-layer structure including Al, Ag, Cu, Pb, Mo, Ti, or an alloy thereof. For example, the first electrode 323 may be formed in a structure such that a transparent conductive film, an opaque conductive film, and a transparent conductive film are sequentially stacked, or such that a transparent conductive film and an opaque conductive film are sequentially stacked.

The light-emitting layer 325 is formed by stacking, on the first electrode 323, a hole-related layer, an organic light-emitting layer, and an electron-related layer, either in that order or in the reverse order.

A bank layer 324 is a pixel-defining film that exposes the first electrode 323 of each sub-pixel. The bank layer 324 may be formed of an opaque material (e.g., black material) in order to prevent optical interference between neighboring sub-pixels. In this case, the bank layer 324 includes a light-blocking material including at least one of a color pigment, organic black, or carbon. A spacer 326 may be further disposed on the bank layer 324.

The second electrode 327, which is the cathode, is formed on the upper surface and the side surfaces of the light-emitting layer 325 so as to face the first electrode 323, with the light-emitting layer 325 interposed therebetween. The second electrode 327 may be integrally formed on the entire surface of the active area. In the case in which the second electrode 327 is applied to a top-emission-type organic light-emitting display device, the second electrode 327 may be formed as a transparent conductive film formed of, for example, indium-tin-oxide (ITO) or indium-zinc-oxide (IZO).

An encapsulation portion 390 for preventing the permeation of moisture may be further disposed on the second electrode 327.

The encapsulation portion 390 may include a first inorganic encapsulation layer 328a, a second organic encapsulation layer 328b, and a third inorganic encapsulation layer 328c, which are sequentially stacked.

The first inorganic encapsulation layer 328a and the third inorganic encapsulation layer 328c may be formed of an inorganic material such as silicon oxide (SiOx). The second organic encapsulation layer 328b may be formed of an organic material such as acrylic resin, epoxy resin, phenolic resin, polyamide resin, or polyimide resin.

As is apparent from the above description, in an organic light-emitting display device according to some embodiments of the present disclosure, each of a driving thin-film transistor and a switching thin-film transistor includes an oxide semiconductor pattern, thereby reducing power consumption. In addition, there is provided a thin-film transistor capable of effectively operating at low grayscale values. In addition, since each of a source region and a drain region includes conductive regions and non-conductive regions, it may be possible to obtain an effect of increasing (for example, substantially increasing) the length of a channel. Accordingly, the present disclosure is applicable to a high-definition organic light-emitting display device, in which the number of pixels disposed in each unit area is relatively large.

It will be appreciated that the technical spirit of the present disclosure has been described herein only for purposes of illustration through the above description and the accompanying drawings, and that combination, separation, substitution, and modifications of components may be made by those skilled in the art without departing from the scope and spirit of the present disclosure. Therefore, the exemplary embodiments of the present disclosure are provided for illustrative purposes only and are not intended to limit the technical spirit of the present disclosure. The scope of the technical spirit of the present disclosure is not limited thereto. The protection scope of the present disclosure should be interpreted based on the appended claims, and it should be appreciated that all technical spirits falling within a range equivalent to the claims are included in the protection scope of the present disclosure.

What is claimed is:

1. An organic light-emitting display device comprising:
a substrate comprising a display area and a non-display area; and
at least one thin-film transistor comprising a semiconductor pattern including a source region and a drain region, a gate electrode on the semiconductor pattern and a source electrode electrically connected to the source region and a drain electrode electrically connected to the drain region, wherein the source electrode and the drain electrode are positioned on the semiconductor pattern, and
wherein each of the source region and the drain region comprises conductive regions and non-conductive regions that are alternately disposed on the substrate, and the gate electrode is positioned on a layer that covers the source electrode and the drain electrode, or
the gate electrode is positioned on a layer, the layer is positioned directly below the source electrode and the drain electrode and is in direct physical contact with the source electrode and the drain electrode, and the layer has a through hole which the source electrode and the drain electrode are connected to each of the source region and the drain region, and
wherein the conductive regions comprise a first conductive region contacting the source electrode or the drain electrode, and a second conductive region positioned between the gate electrode and the source electrode or between the gate electrode and the drain electrode, and
at least one portion of the non-conductive regions is positioned at an outside edge of the first conductive region in the semiconductor pattern.

2. The organic light-emitting display device according to claim 1, wherein the semiconductor pattern is an oxide semiconductor pattern.

3. The organic light-emitting display device according to claim 1, wherein the first conductive region is conductive due to contact with ions, and the second conductive region is conductive due to ions injected into the second conductive region.

4. The organic light-emitting display device according to claim 1, wherein the at least one thin-film transistor comprises a driving thin-film transistor and at least one switching thin-film transistor, and the driving thin-film transistor comprises a first light-blocking pattern that is below the semiconductor pattern and connected to the source electrode.

5. The organic light-emitting display device according to claim 4, wherein the driving thin-film transistor comprises:
a first semiconductor pattern;
a first gate electrode overlapping the first semiconductor pattern; and
a first source electrode and a first drain electrode connected to the first semiconductor pattern,
wherein the at least one switching thin-film transistor comprises:
a second semiconductor pattern;
a second gate electrode overlapping the second semiconductor pattern; and
a second source electrode and a second drain electrode connected to the second semiconductor pattern, and
wherein the first source electrode, the first drain electrode, the second source electrode, and the second drain electrode are on a same layer.

6. The organic light-emitting display device according to claim 5, wherein the first gate electrode and the second gate electrode are on a same layer that is located above the first source electrode.

7. The organic light-emitting display device according to claim 5, wherein the first gate electrode and the second gate electrode are on a same layer as the first source electrode.

8. The organic light-emitting display device according to claim 5, wherein the first gate electrode and the second gate electrode are on different layers from each other, and a vertical distance between the first gate electrode and the first semiconductor pattern is greater than a vertical distance between the second gate electrode and the second semiconductor pattern.

9. The organic light-emitting display device according to claim 8, wherein the at least one switching thin-film transistor further comprises a second light-blocking pattern, and a vertical distance between the second semiconductor pattern and the second light-blocking pattern is greater than a vertical distance between the first semiconductor pattern and the first light-blocking pattern.

10. The organic light-emitting display device according to claim 4, wherein the driving thin-film transistor is in the display area, and the at least one switching thin-film transistor is in at least one of the display area and the non-display area.

11. The organic light-emitting display device according to claim 9, wherein the second light-blocking pattern is electrically connected to the second gate electrode.

12. A thin-film transistor array substrate comprising:
at least one thin-film transistor comprising a semiconductor pattern including a source region, a drain region, and a channel region that is between the source region and the drain region, a gate electrode on the semiconductor pattern and a source electrode electrically connected to the source region and a drain electrode electrically connected to the drain region, wherein the source electrode and the drain electrode are positioned on the semiconductor pattern, and
wherein each of the source region and the drain region comprises at least two conductive regions and a non-conductive region disposed between the at least two conductive regions, and
the gate electrode is positioned on a layer that covers the source electrode and the drain electrode, or
the gate electrode is positioned on a layer, the layer is positioned directly below the source electrode and the drain electrode and is in direct physical contact with the source electrode and the drain electrode, and the layer has a through hole which the source electrode and the drain electrode are connected to each of the source region and the drain region, and
wherein the at least two conductive regions comprise a first conductive region contacting the source electrode or the drain electrode, and a second conductive region positioned between the gate electrode and the source electrode or between the gate electrode and the drain electrode, and
at least one portion of the non-conductive region is positioned at an outside edge of the first conductive region in the semiconductor pattern.

13. The thin-film transistor array substrate according to claim 12, wherein the at least two conductive regions and the non-conductive region are alternately disposed in each of the source region and the drain region.

14. The thin-film transistor array substrate according to claim 12, wherein the first conductive region is spaced apart from the channel region, and wherein the second conductive region is adjacent to the channel region.

15. The thin-film transistor array substrate according to claim 14, wherein the first conductive region is conductive due to contact with ions, and the second conductive region is conductive due to ions injected into the second conductive region.

16. The thin-film transistor array substrate according to claim 12, further comprising:
a light-blocking pattern below the semiconductor pattern and connected to the source electrode.

17. The thin-film transistor array substrate according to claim 12, wherein the semiconductor pattern is an oxide semiconductor pattern.

18. The thin-film transistor array substrate according to claim 12, wherein the at least one thin-film transistor is at least one of a driving thin-film transistor and a switching thin-film transistor.

19. An organic light-emitting display device comprising the thin-film transistor array substrate according to claim 12.

* * * * *